(12) United States Patent
LoBue

(10) Patent No.: US 8,778,082 B2
(45) Date of Patent: Jul. 15, 2014

(54) POINT SOURCE ASSEMBLY FOR THIN FILM DEPOSITION DEVICES AND THIN FILM DEPOSITION DEVICES EMPLOYING THE SAME

(75) Inventor: Joseph D. LoBue, Dale, TX (US)

(73) Assignee: HelioVolt Corporation, Austin, TX (US)

( * ) Notice: Subject to any disclaimer, the term of this patent is extended or adjusted under 35 U.S.C. 154(b) by 697 days.

(21) Appl. No.: 13/134,401

(22) Filed: Jun. 7, 2011

(65) Prior Publication Data

US 2012/0312236 A1   Dec. 13, 2012

(51) Int. Cl.
*C23C 16/00* (2006.01)
*C23C 14/24* (2006.01)

(52) U.S. Cl.
CPC .................................. *C23C 14/243* (2013.01)
USPC .......................................... 118/727; 118/726

(58) Field of Classification Search
USPC ................................................. 118/726, 727
See application file for complete search history.

(56) References Cited

U.S. PATENT DOCUMENTS

| 5,976,263 A * | 11/1999 | Poole ............................ 118/726 |
| 6,632,285 B2 * | 10/2003 | Wang et al. .................... 118/726 |
| 8,563,084 B2 * | 10/2013 | Gross et al. ................ 427/248.1 |

* cited by examiner

*Primary Examiner* — Keath Chen
(74) *Attorney, Agent, or Firm* — John Bruckner PC

(57) ABSTRACT

A point source assembly for a thin film deposition device having a chamber for holding a substrate, includes a crucible configured for holding and vaporizing a deposition material therein, where the crucible is configured for operative engagement to the chamber, an opening in the crucible configured for directing therefrom a vaporized form of the deposition material, where the opening includes a longitudinal line extending through the center of the crucible opening, and means operatively engaged to the crucible for facilitating rotational movement of the crucible for varying the orientation of the longitudinal line relative to the position of the substrate in the chamber.

13 Claims, 6 Drawing Sheets

POINT SOURCE ASSEMBLY FOR THIN FILM DEPOSITION DEVICES AND THIN FILM DEPOSITION DEVICES EMPLOYING THE SAME

FIELD OF THE INVENTION

The present invention relates to thin film deposition, and more particularly a point source assembly for a thin film deposition device, and thin film deposition devices employing the same for depositing thin films.

BACKGROUND OF THE INVENTION

Several methods for depositing thin films on substrates (i.e., deposition targets) are known in the art. Such methods include physical vapor deposition and chemical vapor deposition. One common form of thin film deposition is evaporation deposition. Evaporation deposition involves vaporizing a deposition or source material under high vacuum, and condensing the vaporized deposition material on a substrate to form a thin film. Operating under vacuum conditions allows the vaporized deposition material to travel unhindered in a direct path to the substrate where it condenses back to a solid state. This process is used to produce thin films with a relatively high level of purity desirable in many applications. The deposition material can be selected from any vaporizable material including, but not limited to, pure elements, compounds, metals, alloys, ceramics, oxides, semiconductors and mixtures thereof.

The typical evaporation deposition device includes a deposition chamber, a vacuum pump for evacuating the deposition chamber, a movable substrate carrier for transferring and supporting a substrate into the deposition chamber, and one or more fixed evaporation or point sources usually located opposite from the substrate. Typically, evaporation deposition is a continuous production process where the substrate is moved through a series of deposition chambers for depositing one or more layers of same or different materials thereon. The substrate carrier can be configured for transferring or moving the substrate from one deposition chamber to another during production.

During the film deposition process, the point sources vaporize the deposition material and direct the resulting vapor flux to the substrate. The point source typically includes a crucible for holding the deposition material, a vaporizer for supplying the energy, typically thermal energy, needed for vaporizing the deposition material (e.g., a heat generator), and an opening in the crucible through which the vaporized deposition material is directed to the substrate in the deposition chamber.

Evaporation deposition is used in the fabrication of semiconductor devices such as, for example, thin film solar cells and modules. Thin film solar cells or modules employ, inter alia, thin films of absorber materials composed of elements, binary compounds, ternary compounds and multinary compounds selected from Group I, Group II, Group III, Group IV, and Group VI of the periodic table. One type of absorber material is composed of combinations of copper, indium, gallium, selenium and sulfur (CIGS(S)). The thin films of absorber material are typically deposited on a substrate coated with a back contact metal layer. It is very important that these thin films be deposited with a high degree of uniformity to realize the electrical and mechanical properties necessary for the production of a useful solar cell.

Referring to FIG. 1, a prior art evaporation deposition device 10 includes a housing 12 defining a deposition chamber 14, a movable substrate carrier assembly 16 transporting and supporting a substrate 18 in position at the upper end of the chamber 14 in an operable position for receiving the deposition material, and one or more fixed point sources 20 (two fixed point sources are shown) located at the end of the chamber 14 opposite the substrate 18. The substrate carrier assembly 16 includes a pair of opposed slidably movable railings 17 each supporting opposite ends of the substrate 18, and configured to move the substrate 18 into and out of the deposition chamber 14. The substrate carrier assembly 16 can be adapted for conveying or transporting the substrate 18 between two or more deposition chambers 14 for continuous processing or production. The substrate carrier assembly 16 may be selected from any other suitable substrate transport mechanism as known in the art (e.g., conveyor assembly).

The fixed point sources 20 are maintained in a spaced apart arrangement within the deposition chamber 14 and remain in a fixed position such that the longitudinal axis passing through the point source 20 is contiguous with the longitudinal axis of the opening leading to the deposition chamber 14. The term "contiguous" as used herein means that the line passing through the center of the opening leading to the chamber 14 will likewise pass through the center of the fixed point source 20.

Each point source 20 includes a crucible 22, containing a deposition material 24 and a vaporizer or source of energy (not shown) operatively associated with the crucible 22 for vaporizing the deposition material 24. An example of such sources of energy is an electrical heating device for supplying sufficient heat to vaporize the deposition material 24. The crucible 22 further includes a fixed opening 26 having a longitudinal axis 29 through which the vaporized deposition material is directed to the substrate 18 as a vapor flux plume 28. The longitudinal axis 29 is likewise the longitudinal axis passing through the crucible 22. The plumes 28 produced by the point sources 20 are directed to the substrate 18 in a manner such that a portion of opposed plumes 28 overlap one another forming an overlap region 32.

FIG. 1 shows a normal distribution curve 30 which represents the relative concentration of vaporized deposition material from the center to the lateral sides of the vapor flux plume 28 for a given sized opening 26. The normal distribution curve 30 of fixed point sources 20 demonstrates a relatively narrow bell curve indicating the concentration of the vaporized deposition material is highest at the center of the plume 28 (generally corresponding to the longitudinal axis 29 of the opening 26) with the concentration of the vaporized deposition material 24 diminishing sharply toward the lateral sides of the plume 28. The plumes 28 are directed by the point sources 20 with a portion of each overlapping one another in the overlap region 32.

Referring to FIG. 2, there is shown a top view of the substrate 18 having a thin film 34 deposited by the fixed point sources 20 thereon produced by the type of evaporation deposition device 10 shown in FIG. 1. The deposition pattern of the thin film 34 includes non-uniform deposition areas. More specifically, the thin film 34 includes two areas 36 of relatively dense deposition, a central area 38 of relatively intermediate density deposition and two side areas 40 of relatively low density deposition. The high deposition areas 36 of the thin film 34 are produced by exposure of the substrate 18 to the center portion of the respective plumes 36. The intermediate deposition area 38 of the thin film 34 is produced by exposure of the substrate 18 to the overlap region 32 of the lateral sides of the plume 28. The low deposition areas 40 of the thin film 34 are produced by exposure of the substrate 18 to the lateral sides of the respective plumes 28. (i.e., the areas remote from the center portion of the plumes 28.)

Referring again to FIGS. 1 and 2, the size of the opening 26 can have an effect on the deposition pattern. For example, if the size of the opening 26 is increased (i.e., increased area), the width of the distribution curve 30 increases and the steepness of the center portion of the bell curve is reduced (i.e., becomes less pronounced). This adjustment tends to spread the deposition material over a greater area of the substrate 18 but also increases that part of the distribution curve 30 that does not contact the substrate 18. Overall, the substrate 18 characteristically exhibits an uneven pattern of deposition material.

Similarly, if the size of the opening 26 decreases, the substrate 18 will exhibit a different, but still uneven pattern of distribution. In particular, as the width of the distribution curve decreases, the steepness of the center portion increases. Thus, the distribution of deposition material is focused on a smaller area of the substrate 18 and the overlap region 32 will be reduced or eliminated.

It can readily be seen that varying the size of the opening 26, while varying the pattern of distribution does not achieve a desired uniform deposition over the entire substrate 18. In order to obtain uniform deposition under these prior art conditions, it is often necessary to subject the substrate to post-deposition operations to alter the deposition pattern on the substrate 18. Post deposition operations add significantly to the cost and time of producing finished substrates.

The use of fixed point sources 20 significantly limits the ability of thin film deposition devices to produce thin films 34 with a high degree of uniformity or desired thickness patterns, or to readily accommodate substrates of different sizes and/or shapes. This is due in part to the fixed position of the longitudinal axis of the opening leading to the chamber and the point source. In particular, the longitudinal axis of the chamber and the point source are in a fixed orientation and do not vary.

One approach to overcome the uneven deposition patterns is to periodically interrupt the deposition process (i.e., shutting off or taking the evaporation deposition device offline) to perform adjustments needed to achieve the desired film uniformity, thickness pattern and the like. This approach is very costly, time consuming, and labor-intensive.

In view of the foregoing problems and limitations, there is a need for a point source assembly and thin film deposition devices employing the same for depositing thin films, that enables adjustment of deposition parameters in situ to produce thin films on a substrate with a high degree of uniformity or desired thickness patterns in a cost effective manner. There is a further need for a point source assembly and thin film deposition devices employing the same for depositing thin films, that enhances production yield, reduces downtime, and/or reduces the number of point sources needed to achieve desired deposition uniformity.

SUMMARY OF THE INVENTION

The present invention relates generally to a point source assembly for a thin film deposition device having a chamber for holding a substrate in which the longitudinal axis of the opening leading to the chamber and the longitudinal axis of the point source can vary from one another in situ thus providing a more convenient, real-time means for making deposition adjustments.

The point source assembly of the present invention generally includes a crucible for holding and vaporizing a deposition material to generate a vapor flux plume and an opening in the crucible for directing the vapor flux plume containing the vaporized deposition material toward a substrate. The vapor flux plume travels to the substrate and condenses on the surface of the substrate to form a thin film thereon. The point source assembly of the present invention is designed to enable the characteristics of the vapor flux plume to be readily changed or modified by enabling the longitudinal axis of the opening leading to the chamber and the longitudinal axis of the point source assembly to vary with respect to each other in situ. In this manner, the uniformity of resulting thin film deposition can be tailored as desired. The present invention improves production yield, while reducing the time and labor typically associated with thin film deposition of substrates.

In one aspect of the present invention, there is provided a point source assembly for a thin film deposition device having a chamber for holding a substrate for receiving a vaporizable material and an opening therein having a first longitudinal axis through which a vaporized deposition material passes therethrough, which comprises:

a crucible configured for holding and vaporizing a deposition material therein, the crucible being configured for operative engagement to the chamber, said crucible having an opening therein configured for directing therefrom a vaporized form of the deposition material through the opening of the chamber, said crucible having a second longitudinal axis; and means for moving the crucible to vary the orientation of the first and second longitudinal axis with respect to each other during the time when the vaporized material is directed toward the substrate.

In another aspect of the present invention, there is provided thin film deposition device employing the present point source assembly for depositing thin films as well as a method of forming thin films using the deposition device.

BRIEF DESCRIPTION OF THE DRAWINGS

The following drawings are illustrative of embodiments of the present invention and are not intended to limit the invention as encompassed by the claims forming part of the application.

DETAILED DESCRIPTION OF THE INVENTION

Figure 1:
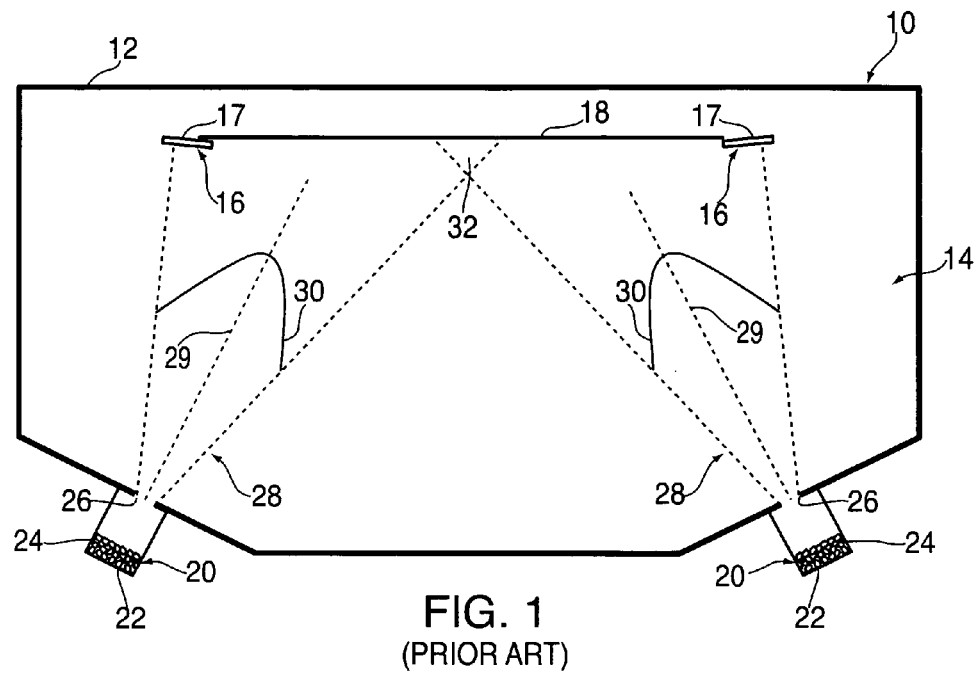
FIG. 1 is a side cross sectional view of a prior art evaporation deposition device.

The present invention is generally directed to a point source assembly for a thin film deposition device having a chamber for holding a substrate in which the orientation of the longitudinal axis of the opening leading to the chamber and the longitudinal axis of the point source is varied from one another during the deposition process.

The point source assembly of the present invention generally includes a crucible for holding and vaporizing a deposition material to generate a vapor flux plume which passes through an opening in the crucible and is thereby directed toward a substrate through a corresponding opening in the chamber. The vapor flux plume travels to the substrate and condenses on the surface of the substrate to form a thin film thereon. The point source assembly of the present invention is designed to enable the characteristics of the vapor flux plume to be readily changed or modified in situ. In this manner, the uniformity of resulting thin film deposition can be varied as desired. The present invention improves production yield and quality, while reducing the cost, time and labor associated with thin film deposition of substrates.

In the present invention, the point source assembly used in the manner described herein provides a cost-effective means for enhancing control of the uniformity of the thin film deposition and accommodating substrates of different sizes and/or shapes, and can be used in the deposition of thin films suitable for manufacturing thin film solar cells or modules such as copper, indium, gallium selenide-based thin film solar cells or modules.

The present invention can be used in the fabrication of a semiconductor layer, coating or film for use in, for example, a thin film solar cell or module, or a photovoltaic device and/or system. However, it will be understood that the present invention is not limited to such use and can be used in various other applications including, but not limited to, the fabrication of a layer, coating or film that may be used in a subassembly, which in turn may be used in a larger assembly, or the fabrication of a superconductor layer, coating or film for use in, for example, an electronic device and/or system.

The present invention provides a point source assembly for a thin film deposition device having a chamber with an opening therein for receiving a vaporizable deposition material for deposition on a substrate held within the chamber. The longitudinal axis passing through the center of the opening leading to the chamber will be referred herein as "OLA". The point source assembly includes a crucible configured for holding and vaporizing the deposition material retained therein, where the crucible is configured for operative engagement to the chamber. There is an opening in the crucible configured for allowing the vaporized deposition material to pass therethrough. A longitudinal axis (crucible longitudinal axis or "CLA") extends through the center of the crucible and crucible opening.

In accordance with the present invention, the orientation between the OLA and the CLA is varied in situ which enables the deposition pattern of the vaporized deposition material to be controlled and, if desired, uniform deposition on the substrate to be achieved.

By varying the orientation between the OLA and the CLA, the vapor flux plume produced during vaporization of the deposition material can be controlled and the pattern of deposition of the vaporizable deposition material on the substrate adjusted in situ.

The variation in orientation between the OLA and the CLA can be accomplished in several ways. One method of varying the orientation of the respective axes is to provide movement to the crucible so that the CLA goes into and out of alignment with the OLA. Another method is to move the crucible so that the CLA is constantly changing in a particular pattern relative to the OLA. The movement may be oscillatory, rotational, linear, or combinations thereof. In a preferred embodiment of the present invention, the point source assembly further includes means operatively engaged to the crucible for rotationally moving the crucible where the CLA is offset from OLA.

The term "deposition material" as used herein refers to any vaporizable film forming material, which condenses into a solid form upon contact with the surface of a substrate. The deposition material may be selected from pure elements, and compounds including binary compounds, ternary compounds and multinary compounds, selected from, for example, metals, alloys, ceramics, oxides, semiconductors and mixtures thereof. The deposition may be selected from Group I, Group II, Group III, Group IV, and Group VI of the periodic table, including, but not limited to, copper, indium, gallium, selenium and sulfur and mixtures thereof.

Examples of Group I elements include copper, silver, and gold. Examples of Group II elements include zinc and cadmium. Examples of Group III elements include indium, gallium, and aluminum. Examples of Group IV elements include tin, germanium, and silicon. Examples of Group VI elements include selenium, sulfur, and tellurium.

More preferred combinations of precursor material include those selected from:

a) Group I, Group III and Group VI (e.g., copper indium gallium selenide (CIGS));

b) Group II and Group VI (e.g., cadmium telluride (CdTe)); and c) Group I, Group II, Group IV and Group VI (e.g., copper zinc tin sulfide (CZTS)).

The term "substrate" as used herein refers to any solid material compatible with the deposition material and capable of both supporting the deposition material thereon as a film, layer or coating, and withstanding the conditions associated with the application of the deposition material thereon. The substrate may be composed of a material selected from glass, metal, ceramics, plastics, and the like, and combinations thereof.

The terms "opening longitudinal axis" or "OLA" as used herein refer to a straight line extending through the opening of the chamber which receives the vaporizable deposition material from the crucible of the point source assembly.

The terms "crucible longitudinal axis" or "CLA" as used herein refer to a straight line extending through the center of the crucible opening therein.

Figure 3:
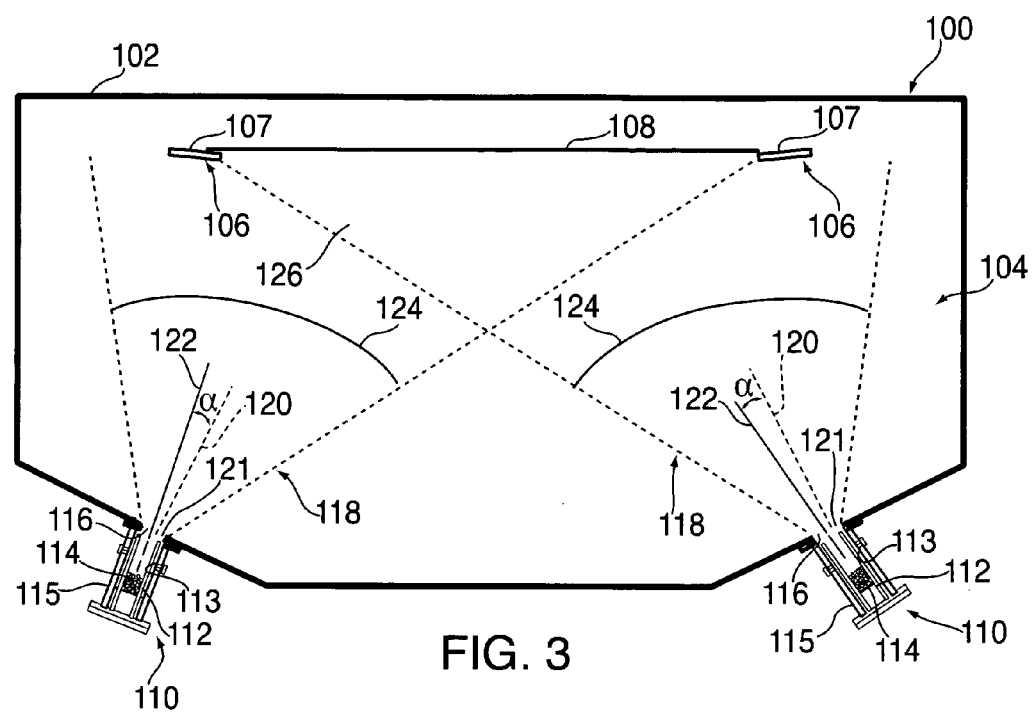
FIG. 3 is a side cross sectional view of an evaporation deposition device comprising a pair of point source assemblies in accordance with one embodiment of the present invention.

Referring to FIG. 3, an evaporation deposition device identified generally by reference number 100 is shown for one embodiment of the present invention. The evaporation deposition device 100 (referred hereinafter as "device") includes a housing 102 having a chamber 104, a movable substrate carrier assembly 106 for transporting and holding a substrate 108 in position within the chamber 104, and an opening 121 having a longitudinal axis (OLA) 120, through which the vaporizable materials travels to the substrate 108. The substrate carrier assembly 106 in the particular embodiment shown in FIG. 3, includes a pair of opposed slidably movable railings 107 each supporting opposite ends of the substrate 108, and configured to move the substrate 108 into and out of the deposition chamber 104. The substrate carrier assembly 106 can be adapted for conveying or transporting the substrate 108 between two or more deposition chambers 104 for continuous processing or production. The substrate carrier assembly 106 may be selected from any other suitable substrate transport mechanism as known in the art (e.g., conveyor assembly).

There is further provided one or more spaced apart point source assemblies 110 located opposite from the substrate carrier 106. The point source assemblies 110 are composed of a refractory material including, but not limited to, metal, ceramic, and the like which is compatible with and inert to a selected deposition material at or near the vaporization temperature of the deposition material.

The point source assemblies 110 each include a crucible assembly 112 defining a holding area 113 adapted for holding a quantity of a deposition material 114, an aperture or opening 116 having a crucible longitudinal axis 122 (CLA) disposed at an upper end of the crucible assembly 112, and a flange casing or housing 115 extending around the crucible assembly 112 for securing attachment of the point source assembly 110 to the housing 102. An energy or heat source (not shown) is operatively associated with the crucible assembly 112 to vaporize the deposition material 114 for deposition as a thin film on the substrate 108.

In accordance with the invention, means are provided for varying the orientation between the OLA and the CLA to effectively control the pattern of deposition on the substrate 108. In the embodiment specifically shown in FIG. 3 and as described below, the crucible assembly 112 undergoes movement during the deposition process which varies the orientation of the CLA 122 with respect to the OLA 120.

The point source assemblies 110 are shown each adapted for movement which varies the CLA associated with the opening 116 relative to the OLA associated with the opening 121. In particular, the CLA 122 of the opening 116 is oriented at an angle, $\alpha$, offset from the OLA 120 of the opening 121. In a preferred embodiment of the present invention, the angle ($\alpha$) is less than 90°, and more preferably, in the range of from about 1° to 30°. During deposition, the crucible assembly 112 is urged to rotate using a corresponding gear drive motor assembly (not shown) at a select speed to direct the vaporized deposition material as a vapor flux plume 118 in a corresponding pattern. The rotation of the crucible assembly 112 may be oscillatory or continuous. In a preferred embodiment of the present invention, the rotational speed is at least 0.1 rpm, more preferably, in the range of from about 0.5 rpm to 100 rpm, and most preferably, from about 0.5 rpm to 6 rpm.

The rotary action of the point source assembly 110 produces a vapor flux plume 118 with a relatively wide area of deposition coverage and a substantially uniform distribution of vaporized deposition material from the center to the lateral sides of the vapor flux plume 118 as indicated by the normal distribution curve 124. The plumes 118 produced by the point source assemblies 110 are directed to the substrate 108 with a portion 126 overlapping over the substrate 108. The overlap portion 126 of the plumes 118 provides a relatively high degree of uniformity in the deposition of the vaporized deposition material over a larger surface area of the substrate 108.

Figure 2:
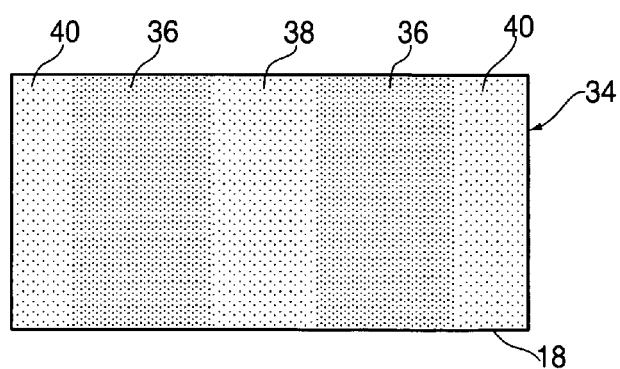
FIG. 2 is a top view of a deposition pattern of a prior art thin film deposited on a substrate by the evaporation deposition device of FIG. 1.
Figure 4:
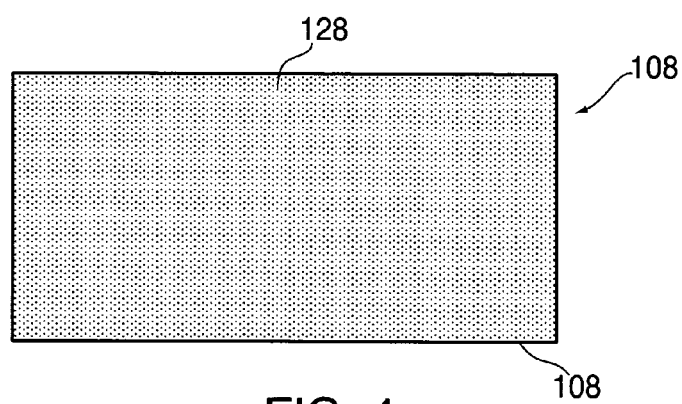
FIG. 4 is a top plan view of a deposition pattern of a thin film deposited on a substrate by the evaporation deposition device of FIG. 3 in accordance with the present invention.

Referring to FIG. 4, a top view of the substrate 108 having a thin film 124 deposited by the point source assemblies 110 is shown. The resulting deposition pattern of the thin film 124 exhibits a high degree of uniformity over a larger surface area of the substrate 108 in contrast to the thin film 34 deposited by the prior art point sources 20 (shown in FIG. 2).

Figure 5:
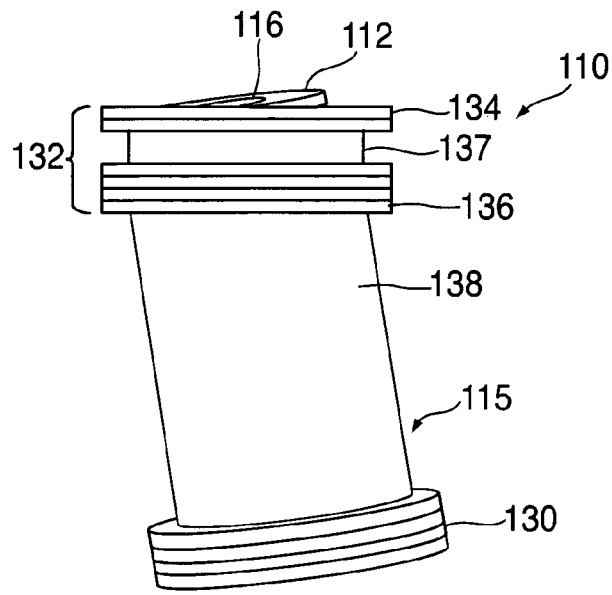
FIG. 5 is a side elevational view of a point source assembly for one embodiment of the present invention.
Figure 6:
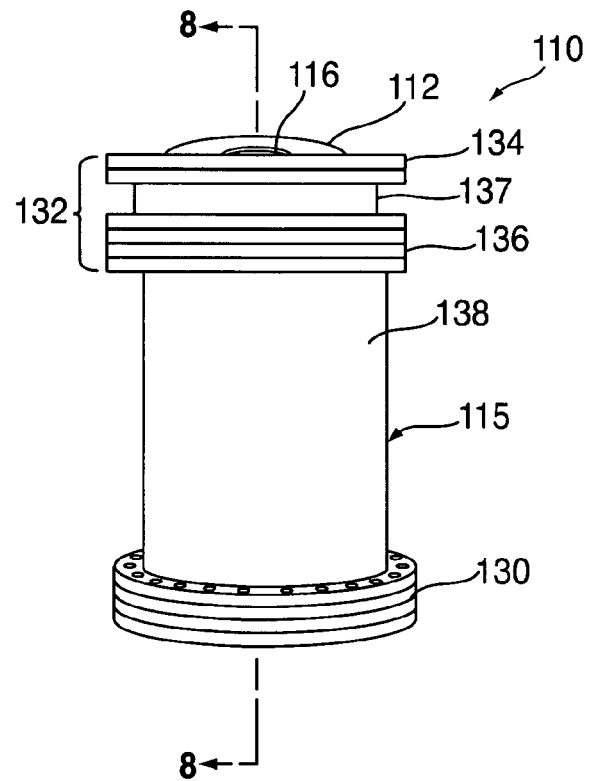
FIG. 6 is a side elevational view of the point source assembly in accordance with the present invention.
Figure 7:
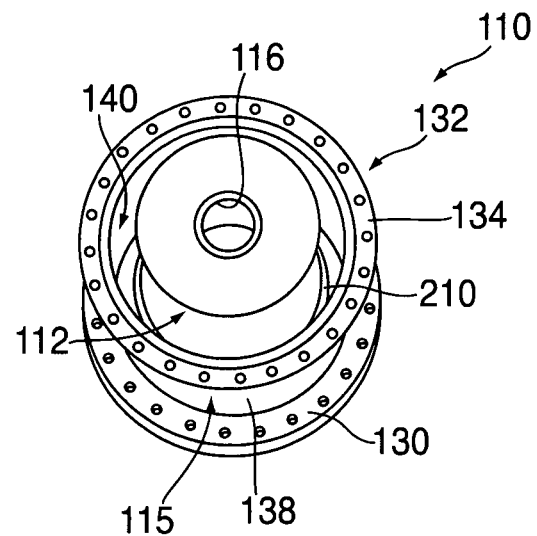
FIG. 7 is a top perspective view of the point source assembly in accordance with the present invention.

Referring to FIGS. 5 to 7, the flange casing 115 of the point source assembly 110 includes a base portion 130, a flange assembly 132 having a fixed upper flange portion 134 adapted for attachment to the chamber housing 102, a rotatable lower flange portion 136, and a rigid neck 137 extending between the upper and lower flange portions 134 and 136, respectively. The flange casing 115 further includes a tubular wall 138 extending between the flange assembly 132 and the base portion 130. The flange casing 115 further defines an interior bore 140 occupied by the crucible assembly 112. The crucible opening 116 located proximate the upper flange portion 134 of the flange assembly 132 has a smaller diameter than the diameter of the holding area 113.

Figure 8:
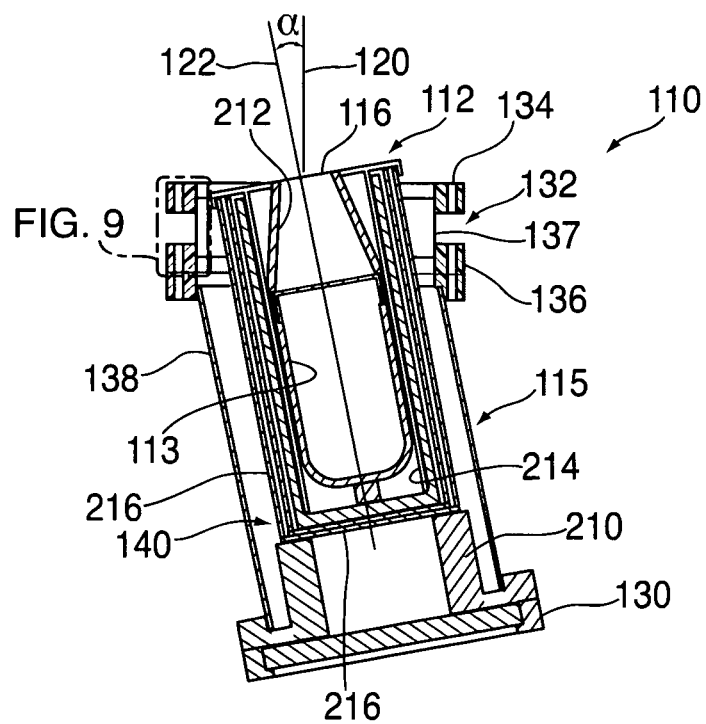
FIG. 8 is a cross sectional view of the point source assembly along lines 8-8 of FIG. 6 in accordance with the present invention.

Referring to FIG. 8, the crucible assembly 112 housed within the flange casing 115 is supported on a platform or support structure 210 affixed securely to the casing base portion 130. The crucible assembly 112 includes a crucible 212 for holding the deposition material, in communication with the opening 116 located proximate the upper flange portion 134, a heater 214 extending around the crucible 212 for supplying energy to vaporize the deposition material within the crucible 212, and a radiation shield 216 surrounding the heater 214. The lower flange portion 136 of the flange assembly 132, crucible assembly 112 and the flange housing 115 comprise an intact, integral structure, and are configured to rotate in the present embodiment relative to the upper flange portion 134 about a fixed axis of rotation which is aligned with the OLA 120. The CLA 122 of the opening 116 is oriented at an angle, $\alpha$, from the OLA 120. The rotary motion of the point source assembly 110 produces the vapor flux plume 118 which differs from a vapor flux plume generated by a stationary point source in that there is a broader more uniform distribution of vaporizable material directed toward the substrate 108.

Figure 9:
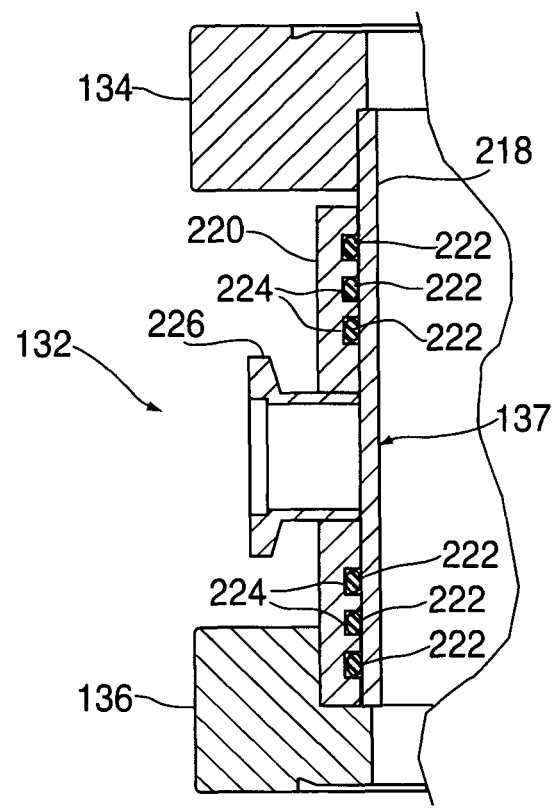
FIG. 9 is an enlarged cross sectional view of a flange assembly at a portion identified by the loop marked FIG. 9 in FIG. 8 in accordance with the present invention.

Referring to FIG. 9, the neck 137 includes an inner cylindrical sleeve 218 rigidly attached to the inside periphery of the upper flange portion 134, and an outer cylindrical sleeve 220 operatively coupled to the inner cylindrical sleeve 218 for facilitating rotational movement therebetween. The outer cylindrical sleeve 220 is rigidly attached to the inside periphery of the lower flange portion 136, and is configured to rotate about the OLA 120 around the inner cylindrical sleeve 218.

A plurality of dynamic radial o-rings 222 is disposed in corresponding channels 224 extending along the inside surface of the outer cylindrical sleeve 220 in operative contact with the outer surface of the inner cylindrical sleeve 218. The o-rings 222 provide a tight seal between the corresponding surfaces of the inner and outer cylindrical sleeves 218 and 220, respectively. Optionally, the outer cylindrical sleeve 220 includes a standard vacuum port 226 to compensate for any pressure leakage that may occur across the o-rings 222. A suitable rotatable vacuum flange assembly is a hollow shaft rotational feed through device, which is commercially available from Ferrotec Corporation of Tokyo, Japan.

Figure 10:
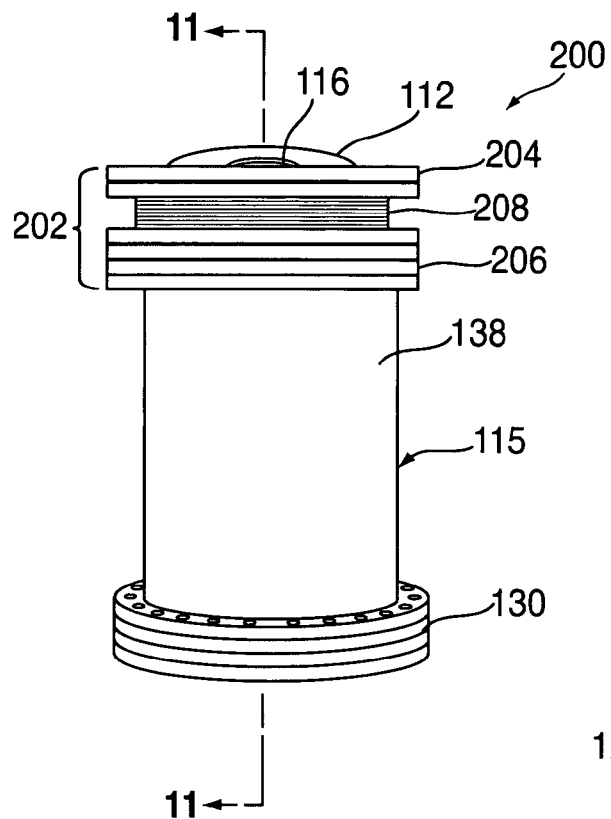
FIG. 10 is a side elevational view of a point source assembly in accordance with another embodiment of the present invention.
Figure 11:
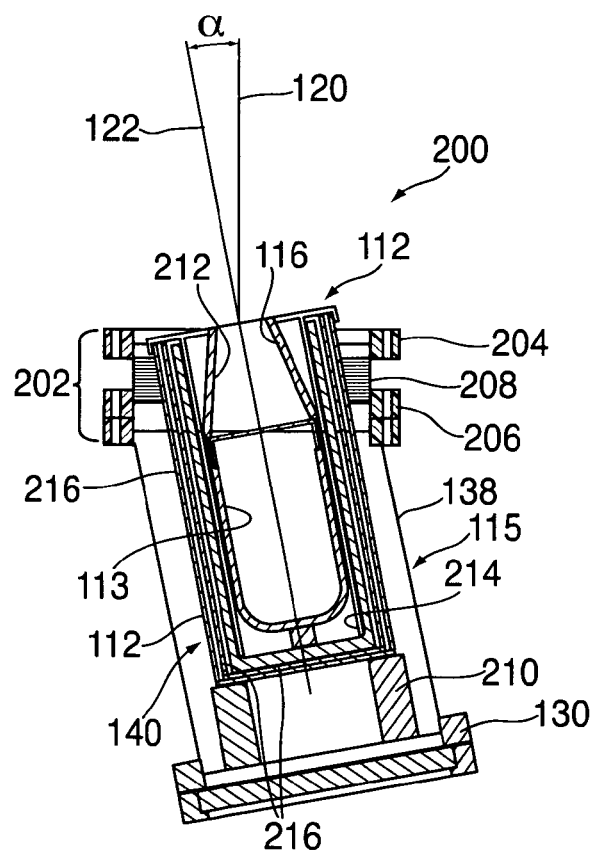
FIG. 11 is a cross sectional view of the point source assembly along lines 11-11 of FIG. 10 in accordance with the present invention.

Referring to FIGS. 10 and 11, a point source assembly 200 is shown for another embodiment of the present invention. The point source assembly 200 is substantially similar to the previous embodiment of the point source assembly 110. The point source assembly 200 includes a flange 202 having an upper portion 204 adapted for attachment to the chamber housing 102, a lower portion 206 and a deformable bellows 208 disposed therebetween. The bellows 208 permits the angle, $\alpha$, to be selectively adjusted to tailor the vapor flux plume according to the size and/or shape of the substrate and the preferred deposition pattern. This adjustment is made by moving the tubular wall 138 and the crucible assembly 112 relative to the upper flange portion 206 as needed to achieve the desired angle, α, between the longitudinal line 122 of the opening 116 and the axis of rotation 120 of the point source assembly 200.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed:

1. A point source assembly for a thin film deposition device having a chamber for holding a substrate for receiving a vaporizable material and an opening therein having a first longitudinal axis through which a vaporized deposition material passes therethrough, comprising:
   a crucible configured for holding and vaporizing a deposition material therein, the crucible being configured for operative engagement to the chamber, said crucible having an opening therein configured for directing therefrom a vaporized form of the deposition material through the opening of the chamber, said crucible having a second longitudinal axis; and
   means for moving the crucible to vary the orientation of the first and second longitudinal axis with respect to each other during the time when the vaporized material is directed toward the substrate; a flange having a fixed upper portion and a rotatable lower portion, said fixed upper portion of the flange configured for attachment to the chamber;
   said flange extending around the crucible and attached to the lower portion of the flange; and
   said lower portion being configured for facilitating rotational movement of the crucible about an axis of rotation coextensive with the first longitudinal axis.

2. The point source assembly of claim 1 further comprising a deformable member disposed between the crucible and the chamber for permitting selective adjustment of the orientation of the opening.

3. The point source assembly of claim 2 wherein the deformable member comprises a tubular bellows extending around the crucible.

4. The point source assembly of claim 1 further comprising means operatively engaged to the crucible for facilitating movement of the crucible.

5. The point source assembly of claim 4 wherein the movement is rotational movement.

6. The point source assembly of claim 5 wherein the rotational speed is at least 0.1 rpm.

7. The point source assembly of claim 6 wherein the rotational speed is in the range of from about 0.5 rpm to 100 rpm.

8. The point source assembly of claim 4 wherein the second longitudinal axis is oriented offset from the first longitudinal axis at an angle (α).

9. The point source assembly of claim 8 wherein the angle (α) is less than 90°.

10. The point source assembly of claim 9 wherein the angle (α) is in the range of from about 1° to 30°.

11. The point source assembly of claim 1 further comprising a deformable member disposed between the lower portion of the flange and the crucible for facilitating selective adjustment of the orientation of the opening.

12. The point source assembly of claim 11 wherein the deformable member comprises a tubular bellows extending around the crucible.

13. A thin film deposition device comprising a housing, and the point source assembly of claim 1 operatively associated with said housing.

* * * * *